(12) United States Patent
Sakai et al.

(10) Patent No.: US 8,038,051 B2
(45) Date of Patent: Oct. 18, 2011

(54) METHOD FOR PRODUCTION OF ELECTRONIC CIRCUIT BOARD

(75) Inventors: Takekazu Sakai, Tokyo (JP); Takashi Shoji, Tokyo (JP)

(73) Assignee: Showa Denko K.K., Tokyo (JP)

( * ) Notice: Subject to any disclaimer, the term of this patent is extended or adjusted under 35 U.S.C. 154(b) by 1077 days.

(21) Appl. No.: 11/579,879

(22) PCT Filed: May 10, 2005

(86) PCT No.: PCT/JP2005/008835
§ 371 (c)(1),
(2), (4) Date: Jul. 30, 2007

(87) PCT Pub. No.: WO2005/109977
PCT Pub. Date: Nov. 17, 2005

(65) Prior Publication Data
US 2007/0284136 A1   Dec. 13, 2007

Related U.S. Application Data

(60) Provisional application No. 60/572,946, filed on May 21, 2004.

(30) Foreign Application Priority Data

May 10, 2004   (JP) ................................ 2004-139394

(51) Int. Cl.
*B23K 31/02* (2006.01)
(52) U.S. Cl. .................................. 228/248.1; 228/180.1
(58) Field of Classification Search .................. None
See application file for complete search history.

(56) References Cited

U.S. PATENT DOCUMENTS

| 4,081,576 | A | * | 3/1978 | Hensel et al. .............. 427/393.6 |
| 5,976,965 | A | * | 11/1999 | Takahashi et al. ............ 438/616 |
| 6,070,788 | A | | 6/2000 | Zakel |
| 6,551,650 | B1 | * | 4/2003 | Carre et al. ..................... 427/58 |
| 2001/0020744 | A1 | * | 9/2001 | Kuramoto et al. ............ 257/738 |
| 2003/0091789 | A1 | * | 5/2003 | Koskenmaki et al. ........ 428/138 |
| 2003/0209585 | A1 | * | 11/2003 | Katayama ....................... 228/41 |

FOREIGN PATENT DOCUMENTS

| DE | 43 40 396 A1 | | 6/1995 |
| EP | 0 595 343 A2 | | 5/1994 |
| EP | 1569503 A1 | * | 8/2005 |
| JP | 2-12830 A | | 1/1990 |
| JP | 7-7244 A | | 1/1995 |
| JP | 07-094853 A | * | 4/1995 |
| JP | 09-001382 A | * | 1/1997 |
| JP | 11-8272 A | | 1/1999 |
| JP | 11-121907 A | * | 4/1999 |
| JP | 11-240612 A | | 9/1999 |
| JP | 2000-82873 A | | 3/2000 |
| JP | 2003-37217 A | | 2/2003 |

OTHER PUBLICATIONS

"Powder Technology Handbook", edited by Society of Powder Technology, Japan, The Nikkan Kogyo Shimbun, Ltd., No. 1, pp. 14-23 (1986).

* cited by examiner

*Primary Examiner* — Kiley Stoner
(74) *Attorney, Agent, or Firm* — Sughrue Mion, PLLC

(57) ABSTRACT

A method for the deposition of a soldering powder to an electronic circuit board includes the steps of imparting stickiness to an exposed metal surface of a substrate and depositing a soldering powder to the resultant sticking part in a liquid body. The method can further include the steps of heating the substrate, thereby fusing the soldering powder, and forming a solder circuit.

10 Claims, No Drawings

METHOD FOR PRODUCTION OF ELECTRONIC CIRCUIT BOARD

CROSS REFERENCE TO RELATED APPLICATIONS

This application is an application filed under 35 U.S.C. §111 (a) claiming the benefit pursuant to 35 U.S.C. §119 (e) (1) of the filing dates of Provisional Application No. 60/572,946 filed May 21, 2004 and Japanese Patent Application No. 2004-139394 filed May 10, 2004 pursuant to 35 U.S.C. §111 (b).

TECHNICAL FIELD

This invention relates to a method for the production of an electronic circuit board. More particularly, the invention relates to a method for forming a solder layer on the surface of a fine conductive circuit electrode on an electronic circuit board, particularly a printed-wiring board.

BACKGROUND ART

In recent years, a printed-wiring board having a circuit pattern formed on an insulating substrate, such as a plastic substrate, a ceramic substrate or a metallic substrate coated with plastic, has been developed. Means to configure an electronic circuit by soldering electronic components, such as an IC element, a semiconductor chip, a resistor and a condenser, on the circuit pattern has been widely adopted.

In this case, for the purpose of bonding the lead terminals of the electronic components at the stated parts of the circuit pattern, the procedure which comprises a step of preparatorily forming a thin layer of solder on the surface of a conductive circuit electrode on the substrate, printing a solder paste or a flux thereon, positioning and loading the electronic components thereon and then reflowing the thin layer of solder alone or the thin layer of solder in conjunction with the solder paste, thereby bonding the layer by soldering is generally followed.

Recently, the electronic circuit boards have been in need of satisfying the trend of fine pitch with a view to miniaturizing electronic products. Fine pitch parts, such as, for example, the LSI of the QFP (quad flat package) type and the CSP (chip size package) each having a pitch of 0.3 mm, and the FC (flip chip) having a pitch of 0.15 mm, have come to be mounted on the electronic circuit boards in numerous quantities. The electronic circuit boards, therefore, are required to have a fine solder circuit pattern which conforms to the fine pitch.

The formation of a solder circuit with a solder film on the printed-wiring board is being accomplished by the plating method, the hot air leveler (HAL) method, or the method which comprises a step of printing the paste of solder powder and a step of reflowing the printed paste. The method for producing a solder circuit by the plating technique, however, incurs difficulty in adding to the thickness of the solder layer, and the HAL method and the method resorting to the printing of a solder paste encounter difficulty in coping with the fine pitch pattern.

As a way of forming a solder circuit without requiring such a troublesome operation as aligning a circuit pattern, a method which comprises causing a stickiness-imparting compound to react with the surface of a conductive circuit electrode of a printed-wiring board, thereby imparting stickiness to the surface, depositing solder powder on the sticking part consequently formed and then heating the printed-wiring board, thereby melting the solder and forming a solder circuit has been disclosed (refer, for example, to JP-A HEI 7-7244).

By the method disclosed in JP-A HEI 7-7244, it has been made possible to form a fine solder circuit pattern by a simple operation and provide a highly reliable circuit board. Since this method effects dry deposition of the solder powder on the circuit board, it entails such problems as suffering the powder to be electrostatically deposited on an extraneous portion, inducing drift of the powder, interfering the fine spacing of a circuit board and preventing the powder from being efficiently utilized. These problems gain in conspicuousness particularly when the solder powder to be used has a very fine size.

This invention is aimed at solving these problems and, in the method which comprises causing a stickiness-imparting compound to react with the surface of a conductive circuit electrode of a printed-wiring board, thereby imparting stickiness to the surface, depositing solder powder on the sticking part consequently formed and then heating the printed-wiring board, thereby melting the solder and forming a solder circuit as disclosed in JP-A HEI 7-7244, at providing a method for the production of an electronic circuit board capable of realizing a still finer circuit pattern, an electronic circuit board provided with a very fine circuit pattern and endowed with high reliability, and a circuit board having mounted therein electronic components and enabled to materialize high reliability and high mounting density.

DISCLOSURE OF THE INVENTION

The present inventor has pursued a diligent study with a view to solving the problems mentioned above and has consequently perfected this invention.

The first aspect of the present invention provides a method for the deposition of a soldering powder to an electronic circuit board, comprising the steps of imparting stickiness to an exposed metal surface of a substrate and depositing a soldering powder to a resultant sticking part in a liquid body.

The second aspect of the invention provides a method for the production of an electronic circuit board, comprising the steps of imparting stickiness to an exposed metal surface of a substrate, depositing a soldering powder to a resultant sticking part in a liquid body, heating the substrate, thereby fusing the soldering powder, and forming a solder circuit.

The third aspect of the invention provides the method according to the first or second aspect, wherein the step of depositing the soldering powder in the liquid body is performed by immersing a printed-wiring board in the liquid body having the soldering powder dispersed therein.

The fourth aspect of the invention provides the method according to any one of the first to third aspects, wherein the liquid body to be used for the deposition of the soldering powder is water.

The fifth aspect of the invention provides the method according to any one of the first to fourth aspects, wherein the liquid to be used for the deposition of the soldering powder has a rust-resisting agent incorporated therein.

The sixth aspect of the invention provides the method according to any one of the first to fifth aspects, wherein the soldering powder has a surface given a coating for prevention of oxidation.

The seventh aspect of the invention provides the method according to any one of the first to sixth aspects, wherein the substrate is given vibration during the deposition of the soldering powder thereon in the liquid body.

The eighth aspect of the invention provides the method according to the seventh aspect, wherein the vibration is low-frequency vibration.

The ninth aspect of the invention provides the method according to any one of the first to eighth aspects, wherein the soldering powder in the liquid body during the deposition of the soldering powder in the liquid body has a concentration in a range of 0.5 to 50 apparent volume %.

The tenth aspect of the invention provides the method according to any one of the sixth to ninth aspects, wherein the coating of the soldering powder is effected with a benzothiazole derivative, an amine having an alkyl group of 4 to 10 carbon atoms as a side chain thereof, thiourea, a silane coupling agent, lead, tin, gold, an inorganic acid salt or an organic acid salt.

The eleventh aspect of the invention provides the method according to the tenth aspect, wherein the organic acid salt is at least one member selected from the group consisting of lauric acid, myristic acid, palmitic acid and stearic acid.

The twelfth aspect of the invention provides an electronic circuit board manufactured through the method for the production of an electronic circuit board according to any one of the first to eleventh aspects.

The thirteenth aspect of the invention provides a method for mounting an electronic component, comprising a step of loading the electronic component on the electronic circuit board according to the twelfth aspect and a step of reflowing the soldering powder, thereby bonding the electronic component.

The fourteenth aspect of the invention provides an electronic circuit board having mounted thereon the electronic component manufactured by the method of mounting an electronic component according to the thirteenth aspect.

By the method contemplated by this invention for the production of an electronic circuit board, it has been made possible to form a fine solder circuit pattern with a simple operation. The method particularly has brought about an effect of decreasing the short circuits with a solder metal between the adjacent circuit patterns even in a very fine circuit pattern and has conspicuously exalted the reliability of an electronic circuit board. Further, by the method contemplated by this invention for the production of an electronic circuit board, it has been made possible to materialize miniaturization and exaltation of high reliability of a circuit board having electronic parts mounted thereon and provide an electronic device of outstanding characteristic properties.

BEST MODE FOR CARRYING OUT THE INVENTION

The printed-wiring boards which constitute the subjects of this invention include plastic substrates, plastic film substrates, glass fabric substrates, paper-based epoxy resin substrates, substrates having a metal sheet superposed on ceramic substrates, one side printed-wiring boards having a circuit pattern formed with a conductive substance, such as metal, on an insulating substrate resulting from coating a metal matrix with plastic or ceramic, double side printed-wiring boards, multilayer printed-wiring boards and flexible printed-wiring boards, for example.

This invention utilizes a method which comprises causing a stickiness imparting compound to react with the surface of a conductive circuit electrode of a printed-wiring board, for example, thereby imparting stickiness to the surface, depositing solder powder on the sticking part consequently formed and then heating the printed-wiring board, thereby melting the solder, and forming a solder circuit.

As the conductive substance for forming the circuit, copper is used in most cases. This invention does not need to limit the conductive substance to copper but may adopt any conductive substance which is enabled by the stickiness imparting substance which will be specifically described herein below to produce stickiness on the surface thereof. As concrete examples of this substance, the substances which contain Ni, Sn, Ni—Al, solder alloy and so on.

As the stickiness imparting compounds which can be preferably used in this invention, naphthotriazole derivatives, benzotriazole derivatives, imidazole derivatives, benzoimidazole derivatives, mercapto benzothiazole derivatives and benzothiazole thio fatty acids can be cited. While these stickiness imparting compounds manifest a strong effect particularly on copper, they are capable of imparting stickiness to the other conductive substances.

The benzotriazole derivatives are represented by this general formula (1).

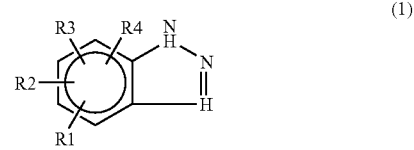

(1)

In this invention, R1 to R4 in the general formula (1) independently denote a hydrogen atom, an alkyl group having a carbon atom number in the range of 1 to 16, preferably 5 to 16, an alkoxy group, F, Br, Cl, I, a cyano group, an amino group, or an OH group.

These compounds, as benzotriazole derivatives represented by the general formula (1), have their stickiness generally gain in strength in proportion as R1 to R4 have their carbon atom numbers increase.

The naphtotriazole derivatives are represented by this general formula (2).

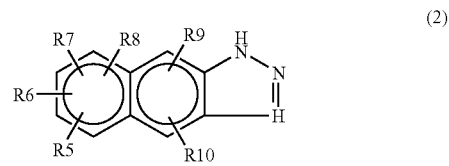

(2)

In this invention, R5 to R10 in the general formula (2) independently denote a hydrogen atom, an alkyl group having a carbon atom number in the range of 1 to 16, preferably 5 to 16, an alkoxy group, F, Br, Cl, I, a cyano group, an amino group, or an OH group.

The imidazole derivatives are represented by this general formula (3).

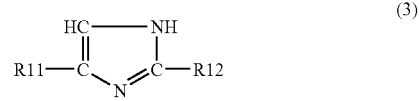

(3)

In this invention, R11 and R12 in the general formula (3) independently denote hydrogen, an alkyl group having a carbon atom number in the range of 1 to 16, preferably 5 to 16, an alkoxy group, F, Br, Cl, I, a cyano group, an amino group, or an OH group.

The benzoimidazole derivatives are represented by this general formula (4).

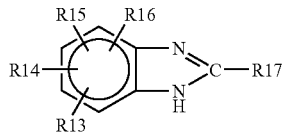

In this invention, R13 to R17 in the general formula (4) independently denote a hydrogen atom, an alkyl group having a carbon atom number in the range of 1 to 16, preferably 5 to 16, an alkoxy group, F, Br, Cl, I, a cyano group, an amino group, or an OH group.

The imidazole derivatives and the benzoimidazole derivatives represented by the general formula (3) and the general formula (4) also have their stickiness generally gain in strength in proportion as R11 to R17 have their carbon atom numbers increase. The mercapto benzothiazole derivatives are represented by this general formula (5).

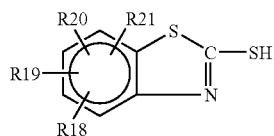

In this invention, R18 to R21 in the general formula (5) independently denote a hydrogen atom, an alkyl group having a carbon atom number in the range of 1 to 16, preferably 5 to 16, an alkoxy group, F, Br, Cl, I, a cyano group, an amino group, or an OH group.

The benzothiazole thio fatty acid derivatives are represented by this general formula (6).

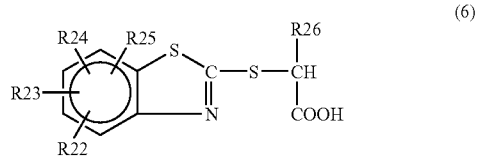

In this invention, R22 to R26 in the general formula (6) independently denote a hydrogen atom, an alkyl group having a carbon atom number in the range of 1 to 6, preferably 1 or 2, an alkoxy group, F, Br, Cl, I, a cyano group, an amino group, or an OH group.

In the benzothiazole thio fatty acid derivatives represented by the general formula (6), R22 to R26 are preferred to have a carbon atom number 1 or 2.

In this invention, for the impartation of stickiness to the surface of the conductive circuit electrode on the printed-wiring board, at least one of the stickiness imparting compounds mentioned above is dissolved in water or acidic water and adjusted to a slightly acidic state preferably in the range of pH 3 to 4 prior to use. As concrete examples of the substance to be used for the adjustment of pH, inorganic acids, such as hydrochloric acid, sulfuric acid, nitric acid and phosphoric acid, may be cited where the conductive substance is a metal. As concrete examples of the organic acid, formic acid, acetic acid, propionic acid, malic acid, oxalic acid, malonic acid, succinic acid and tartaric acid may be cited. While the concentration of the stickiness imparting compound is not rigidly restricted and is properly adjusted to suit the condition of use, the concentration in the range of 0.05 mass % to 20 mass % of the whole solution is preferably usable. If the concentration falls short of the lower limit of this range, the shortage will be at a disadvantage in preventing the sticky film from being formed fully satisfactorily.

The temperature of the treatment slightly increased from room temperature is rather advantageous in terms of the speed of formation and the amount of formation of the sticky film. While it is not restricted but is varied as with the concentration of the stickiness imparting compound and the kind of the pertinent metal, it is generally proper in the approximate range of 30° C. to 60° C. The time of immersion is not restricted but is preferably made as by adjusting other conditions to fall in the approximate range of 5 seconds to 5 minutes from the viewpoint of the efficiency of operation.

Incidentally, in this case, the presence of copper (monovalent or divalent) in an amount of 100 to 1000 ppm as ion in the solution is at an advantage in exalting the efficiency of formation of the sticky film in terms of the speed of formation and the amount of formation.

The printed-wiring board is advantageously treated with a stickiness-imparting compound solution when it is prepared in advance in such a state having the part of the conductive circuit not in need of soldering covered with a resist and only the electrode part of the conductive circuit of the circuit pattern (the exposed surface of metal on the substrate) left exposed.

Here, by immersing the printed-wiring board in the stickiness imparting compound solution to be used as described above or coating the board with the solution, it is made possible to impart stickiness to the surface of the conductive circuit. This invention is characterized by effecting the deposition of a solder powder on the electronic wiring board endowed with stickiness in a liquid body. By carrying out the deposition of the solder powder in the liquid body, it is made possible to prevent the solder powder from being deposited electrostatically on the part lacking stickiness and prevent the solder powder from being electrostatically flocculated and allow formation of a fine pitch circuit board and use of a finely divided solder powder.

This invention prefers the deposition of the solder powder in the liquid body to be effected by immersing the printed-wiring board in a solution having the solder powder dispersed therein. During the deposition of the solder powder, it is advantageous to exert vibration preferably in the range of 0.1 Hz to several kHz and particularly preferably a low frequency vibration on the solution having the solder powder dispersed therein. The concentration of the solder powder in the solution during the deposition of the solder powder in the liquid body is preferably in the range of 0.5 to 10 apparent volume % and more preferably in the range of 3 to 8 apparent volume %.

This invention prefers to use water as the liquid body to be used for the deposition of the solder powder. It also prefers to add a rust-resisting agent to the liquid body for the purpose of preventing the solid powder from being oxidized by the dissolved oxygen in the liquid body.

This invention prefers to coat the surface of the solder powder with the object of preventing the solder powder from being oxidized. The coating agents for the solder powder include benzothiazole derivatives, amines having an alkyl group of a carbon atom number in the range of 4 to 10 as a side chain, thiourea, silane coupling agents, lead, tin, gold, inorganic acid salts and organic acid salts. Preferably, the coating is performed by using at least one member selected from the group of coating agents enumerated above. As the organic acid salt, preferably at least one member selected from the group consisting of lauric acid, myristic acid, palmitic acid and stearic acid is used.

The method of treatment contemplated by this invention can be effectively used not only for the solder-precoated circuit board mentioned above but also for the formation of a bump for BGA bonding, for example. It is naturally embraced in the electronic circuit board of this invention.

As concrete examples of the metal composition for the solder powder to be used in the method for the production of the electronic circuit board according to this invention, the Sn—Pb-based, Sn—Pb—Ag-based, Sn—Pb—Bi-based, Sn—Pb—Ag-based and Sn—Pb—Cd-based alloys may be cited. From the recent prevalent viewpoint of excluding Pb from the industrial waste, the Sn—In-based, Sn—Bi-based, In—Ag-based, In—Bi-based, Sn—Zn-based, Sn—Ag-based, Sn—Cu-based, Sn—Sb-based, Sn—Au-based, Sn—Bi—Ag—Cu-based, Sn—Ge-based, Sn—Bi—Cu-based, Sn—Cu—Ag-based, Sn—Ag—Zn-based, Sn—Cu—Ag-based, Sn—Bi—Sb-based, Sn—Bi—Sb—Zn-based, Sn—Bi—Cu—Zn-based, Sn—Ag—Sb-based, Sn—Ag—Sb—Zn-based, Sn—Ag—Cu—Zn-based and Sn—Zn—Bi-based alloys which do not contain Pb prove advantageous.

As concrete examples of the metal composition mentioned above, the eutectic crystal solder composed of 63 mass % of Sn and 37 mass % of Pb (hereinafter represented as "63Sn-37Pb") as the center, 62Sn-36Pb-2Ag, 62.6Sn-37Pb-0.4Ag, 60Sn-40Pb, 50Sn-50Pb, 30Sn-70Pb, 25Sn-75Pb, 10Sn-88Pb-2Ag, 46Sn-8Bi-46Pb, 57Sn-3Bi-40Pb, 42Sn-42Pb-14Bi-2Ag, 45Sn-40Pb-15Bi, 50Sn-32Pb-18Cd, 48Sn-52In, 43Sn-57Bi, 97In-3Ag, 58Sn-42In, 95In-5Bi, 60Sn-40Bi, 91Sn-9Zn, 96.5Sn-3.5Ag, 99.3Sn-0.7Cu, 95Sn-5Sb, 20Sn-80Au, 90Sn-10Ag, 90Sn-7.5Bi-2Ag-0.5Cu, 97Sn-3 Cu, 99Sn-1Ge, 92Sn-7.5Bi-0.5Cu, 97Sn-2Cu-0.8Sb-0.2Ag, 95.5Sn-3.5Ag-1Zn, 95.5Sn-4Cu-0.5Ag, 52Sn-45Bi-3 Sb, 51Sn45Bi-3Sb-1Zm, 85Sn-10Bi-5Sb, 84Sn-10Bi-5Sb-1Zn, 88.2Sn-10Bi-0.8Cu-1Zn, 89Sn-4Ag-7Sb, 88Sn-4Ag-7Sb-1Zn, 98Sn-1Ag-1Sb, 97Sn-1Ag-1Sb-1Zn, 91.2Sn-2Ag-0.8Cu-6Zn, 89Sn-8Zn-3Bi, 86Sn-8Zn-6Bi and 89.1Sn-2Ag-0.9Cu-8Zn may be cited. The solder powder to be used in this invention may be a mixture of two or more kinds of solder powders different in composition.

When the electronic circuit board of this invention is manufactured by using an alloy composition selected from the Pb-free solders, particularly preferably from the solders containing Sn and Zn, or Sn, Zn and Bi, among other solder powders enumerated above, it allows elongation of the service life of a part mounted thereon and diversification of the part because it permits the reflow temperature to be lowered to the same level as the Sn—Pb-based solder.

As regards the particle diameter of a solder powder, Japanese Industrial Standard (JIS) specify that the diameter of the powder found by a screen classifier must fall in the range of 53 to 22 μm, 45 to 22 μm, and 38 to 22 μm, etc. For the determination of an average particle diameter of the solder powder of this invention, the method which resorts to the use of a standard sieve and a balance as specified by JIS can be generally adopted. The determination can be otherwise effected by the image analysis with a microscope or the electrozone method with a coal-tar counter. The principle of the operation of the coal-tar counter is described in the "Manual of Powder Technology" (compiled by Particle Technology Society, 1$^{st}$ edition, pp. 19-20). This counter determines the powder diameter distribution of a given powder by passing a solution having the powder dispersed therein through fine pores formed in a diaphragm and measuring the change in electric resistance on the opposite sides of the pores. It is capable of determining the ratios of individual particles with satisfactory reproducibility.

The electronic circuit board which is manufactured by this invention can be favorably in a method for mounting an electronic component by a procedure comprising a step of loading the electronic component in place and a step of reflowing a solder, thereby bonding the electronic component. To the electronic circuit board manufactured by this invention, the electronic component can be bonded, for example, by applying a solder paste by the printing technique on a part of the substrate expected to have the electronic component bonded, loading the electronic component on the part, subsequently heating the electronic component, thereby melting the solder powder in the solder paste, and allowing the molten solder powder to set.

As the method for bonding the electronic circuit board obtained by the method of this invention to the electronic component (mounting method), the surface-mounting technology (SMT), for example, can be used. This mounting method first applies a solder paste by the printing technique to the electronic circuit board, such as, for example, a necessary portion of the circuit pattern. Then, it loads the electronic component, such as a chip part or a QFP, on the spread layer of the solder paste and collectively bonding the relevant parts by means of a reflow heat source. As the reflow heat source, a hot-air oven, an infrared oven, a steam condensing soldering device and a light beam soldering device are available.

The reflowing process contemplated by this invention is variable with the kind of solder alloy composition. In the case of the Sn—Zn-based compositions, such as 91Sn-9Zn, 89Sn-8Zn-3Bi and 86Sn-8Zn-6Bi, the reflow operation is preferably performed by the two-stage process of preheating and reflowing. As regards the conditions for this process, the preheating temperature is in the range of 130 to 180° C. seconds and preferably in the range of 130 to 150° C., the preheating time is in the range of 60 to 120 seconds and preferably in the range of 60 to 90 seconds, the reflowing temperature is in the range of 210 to 230° C. and preferably in the range of 210 to 220° C., and the reflowing time is in the range of 30 to 60 seconds and preferably in the range of 30 to 40 seconds. In the other alloy systems, the reflowing temperatures may be in the range of 20 to 50° C. and preferably in the range of 20 to 30° C. respectively plus the melting points of the alloys to be used and the other preheating temperatures, preheating times, and reflowing times may be in the same ranges as mentioned above.

The reflowing process mentioned above may be carried out in an atmosphere of nitrogen or in the open air. In the case of effecting the operation of reflowing in nitrogen, it is made possible ty setting the oxygen concentration below 5 apparent volume % and preferably below 0.5 apparent volume % to enhance the solder's ability to wet the solder circuit, suppress the occurrence of solder holes and stabilize the treatment.

Thereafter, the electronic circuit board is cooled to complete the surface mounting operation. In the method for manufacturing a product having an electronic component bonded thereto, the work of bonding an electronic component may be performed on both sides of the printed-wiring board. The electronic components which can be used for the method of mounting an electronic component according to this invention include LSI, resistors, condensers, transformers, inductances, filters, radiators, oscillators, etc., through not exclusively.

Now, this invention will be explained below with reference to examples thereof. It should be noted, however, that this invention is not limited to these examples.

Example 1

A printed-wiring board having the smallest electrode spacing of 50 μm was manufactured. As a stickiness imparting compound solution, an aqueous 2 mass % solution of an imidazole-based compound conforming to the general formula (3) by having a hydrogen atom for R11 and an alkyl group of $C_{11}H_{23}$ for R12 was used with the pH value thereof adjusted with acetic acid to about 4. This aqueous solution was heated to 40° C. and the aforementioned printed-wiring board pretreated with an aqueous hydrochloric acid solution was immersed in the heated aqueous solution, with the result that a sticky substance was formed on the surface of a copper circuit.

Subsequently, the printed-wiring board was immersed for 30 seconds in a solution that was obtained by causing a 96.5Sn-3.5Ag solder powder having an average particle diameter of about 20 μm to be dispersed in a concentration of 10 apparent volume % in water. Thereafter, the printed-wiring board was taken out of the solution, washed lightly with purified water and dried.

The printed-wiring board was placed in an oven kept at 240° C. to melt the solder powder and induce formation of a thin layer of 96.5Sn-3.5Ag solder in a thickness of about 20 μm on the exposed part of the copper circuit. The average particle diameter of the solder powder was determined by the use of a microtruck. The solder circuit produced absolutely no abnormal phenomena, such as bridging.

As a method for mounting an electronic component on the electronic wiring board, the operation of surface mounting using a sticky flux was carried out. The sticky flux was prepared by using polymeric rosin and a disproportionating rosin and adding thereto a hydrogenated castor oil as a thixotropic agent and propylene glycol monophenyl ether as a solvent. This flux was applied by printing in a thickness of 100 μm and a bare chip (Au stand bump about 100 μm in height) was mounted on the layer of the flux and they were heated together with a reflow heat source to effect the soldering. In the reflowing process, the preheating temperature was set at 150° C., the preheating time at 60 seconds, and the reflowing peak temperature at 230° C.

When the electronic component-mounted circuit board resulting from the reflowing process was visually examines, it was found to be an ideal mounted board showing no sign of defective bonding.

Example 2 and Comparative Example 1

The experiments were performed by following the procedure of Example 1 while performing the formation of solder bumps under the conditions shown in Table 1. The results of these experiments were as shown in Table 1.

TABLE 1

| | Treatment Conditions | | | | Rating Results | | | |
| | | | | | State of deposition of powder | | After reflowing | |
| Ex. | Method of deposition | Spacing between electrodes | Particle size of powder | Vibration | Electrode part | Insulating part | Bridge | Wetting property |
| Ex. 1 | In water | 50 μm | 20 μm | No | ○ | ○ | No | Good |
| Comp. Ex. 1 | In open air | 50 μm | 20 μm | No | ○ | X | Yes | Good |
| Ex. 2 | In water | 50 μm | 20 μm | Yes | ⊚ | ○ | No | Good |

In the conventional method (Comparative Example 1) which effected the deposition of a solder powder in the open air, the deposition of the powder entailed the occurrence of a large residue of the powder on the insulating part and the reflowing operation gave rise to a discernible sign of "bridging."

By inserting a low-frequency vibration to the process of deposition, it was made possible to induce intimate deposition of the powder on the electrode part.

Example 3 and Comparative Example 2

Printed boards having an electrode formed in a circular shape with a solid resist were prepared as samples of the formation of a solder bump and were treated by following the procedure of Example 1 while using other conditions as shown in the following table. The results are shown in Table 2.

TABLE 2

| | Treatment Conditions | | | | Rating Results | | |
| | | | | | State of deposition of powder | | Wetting property |
| Ex. | Method of deposition | Electrode | Particle size of powder | Vibration | Electrode part | Insulating part | after reflowing |
| Ex. 3 | In water | 80 μm in diameter | 80 μm | Yes | ⊚ | ○ | Good |
| Comp. Ex. 2 | In open air | 80 μm in diameter | 80 μm | Yes | Δ | X | No coated part formed |

Examples 4 to 6

The experiments of forming a solder bump were made by following the procedure of Example 1 while using other conditions as shown in Table 3. The results are shown in Table 3.

TABLE 3

| Ex. | Treatment Conditions | | | | Rating Results | |
|---|---|---|---|---|---|---|
| | Method of deposition | Solder composition | Coating of powder with Sn | Addition of triethyl amine to water | State of seposition of powder | Wetting property of solder after reflowing |
| Ex. 4 | In water | Sn—8Zn—3Bi | No | No | ○ | Δ |
| Ex. 5 | In water | Sn—8Zn—3Bi | No | Yes | ○ | ○ |
| Ex. 6 | In water | Sn—8Zn—3Bi | Yes | No | ○ | ○ |
| Ex. 1 | In water | Sn—3.5Ag | No | No | ○ | ○ |

INDUSTRIAL APPLICABILITY

In a method for producing an electronic circuit board by imparting stickiness to the metal exposed part of a substrate, depositing a solder powder on the resultant sticky part and then heating the printed-wiring board, thereby melting the solder, and inducing the formation of a solder circuit, this invention has succeeded in bringing an effect of repressing short-circuits with a solder metal between the adjacent circuit patterns even in a very fine circuit pattern and permitting manufacture of an electronic circuit board of conspicuously enhanced reliability. As a result, this invention is enabled to realize miniaturization of and impartation of high reliability to a circuit board having mounted thereon an electronic component possessing a fine circuit pattern and enjoying high reliability and provide an electronic circuit board, a circuit board having mounted thereon an electronic component capable of realizing high reliability and high mounting density and an electronic device possessing excellent characteristic properties.

The invention claimed is:

1. A method for the deposition of a soldering powder to an electronic circuit board, comprising the steps of imparting stickiness to an exposed metal surface of a substrate and depositing a soldering powder to a resultant sticking part in a liquid body, wherein the step of depositing the soldering powder in the liquid body is performed by immersing a printed-wiring board in the liquid body having the soldering powder dispersed therein, wherein the liquid body to be used for the deposition of the soldering powder is water.

2. A method for the production of an electronic circuit board, comprising the steps of imparting stickiness to an exposed metal surface of a substrate, depositing a soldering powder to a resultant sticking part in a liquid body, heating the substrate, thereby fusing the soldering powder, and forming a solder circuit, wherein the step of depositing the soldering powder in the liquid body is performed by immersing a printed-wiring board in the liquid body having the soldering powder dispersed therein, wherein the liquid body to be used for the deposition of the soldering powder is water.

3. A method according to claim 1, wherein the liquid to be used for the deposition of the soldering powder has a rust-resisting agent incorporated therein.

4. A method according to claim 1, wherein the soldering powder has a surface given a coating for prevention of oxidation.

5. A method according to claim 1, wherein the substrate is given vibration during the deposition of the soldering powder thereon in the liquid body.

6. A method according to claim 5, wherein the vibration is low-frequency vibration.

7. A method according to claim 1, wherein the soldering powder in the liquid body during the deposition of the soldering powder in the liquid body has a concentration in a range of 0.5 to 50 apparent volume %.

8. A method according to claim 4, wherein the coating of the soldering powder is effected with a benzothiazole derivative, an amine having an alkyl group of 4 to 10 carbon atoms as a side chain thereof, thiourea, a silane coupling agent, lead, tin, gold, an inorganic acid salt or an organic acid salt.

9. A method according to claim 8, wherein the organic acid salt is at least one member selected from the group consisting of lauric acid, myristic acid, palmitic acid and stearic acid.

10. A method for mounting an electronic component, comprising a step of loading the electronic component on an electronic circuit board and a step of reflowing the solder, thereby bonding the electronic component, wherein the electronic circuit board is manufactured through the method for the production of an electronic circuit board according to claim 1.

* * * * *